(12) United States Patent  
Sasaki (10) Patent No.: US 10,861,523 B2  
(45) Date of Patent: Dec. 8, 2020

(54) SPIN CURRENT MAGNETIZATION ROTATIONAL MAGNETIC ELEMENT, SPIN CURRENT MAGNETIZATION ROTATIONAL MAGNETORESISTANCE EFFECT ELEMENT, AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/506,270

(22) Filed: Jul. 9, 2019

(65) Prior Publication Data

US 2020/0075073 A1  Mar. 5, 2020

(30) Foreign Application Priority Data

Aug. 31, 2018  (JP) ................... 2018-163441

(51) Int. Cl.
*G11C 11/16* (2006.01)
*H01F 10/32* (2006.01)
(Continued)

(52) U.S. Cl.
CPC ........ *G11C 11/161* (2013.01); *G11C 11/1673* (2013.01); *G11C 11/18* (2013.01);
(Continued)

(58) Field of Classification Search
CPC .................................................. G11C 11/161
(Continued)

(56) References Cited

U.S. PATENT DOCUMENTS 8,350,347 B2  1/2013 Gaudin et al.
2007/0096229 A1*  5/2007 Yoshikawa ............. H01L 43/10
257/421

(Continued)

FOREIGN PATENT DOCUMENTS

JP  2014-045196 A  3/2014
WO  2016/021468 A1  2/2016
WO  2016/159017 A1  10/2016

OTHER PUBLICATIONS

I.M. Miron et al. "Perpendicular switching of a single ferromagnetic layer induced by in-place current injection". Nature, vol. 476, 189, 2011.

(Continued)

*Primary Examiner* — Min Huang
(74) *Attorney, Agent, or Firm* — Oliff PLC (57) ABSTRACT

A spin current magnetization rotational magnetic element in which magnetization can be rotated without applying an external magnetic field, power saving and a degree of integration can be enhanced. The spin current magnetization rotational magnetic element includes a spin-orbit torque wiring in a first direction; a first ferromagnetic layer in a second direction, a magnetization direction of the first ferromagnetic layer being configured to change; and a spin injection layer which is in contact with a surface of the spin-orbit torque wiring on a side opposite to the first ferromagnetic layer side and laminated in the second direction, in which the magnetization direction of the first ferromagnetic layer is a Z direction and the magnetization direction of the spin injection layer is an X direction in the first direction.

16 Claims, 3 Drawing Sheets

(51) Int. Cl.
  *G11C 11/18* (2006.01)
  *H01L 27/22* (2006.01)
  *H01L 43/08* (2006.01)
  *H01L 43/04* (2006.01)
  *H01L 43/14* (2006.01)

(52) U.S. Cl.
  CPC ....... *H01F 10/3286* (2013.01); *H01L 27/222* (2013.01); *H01L 43/04* (2013.01); *H01L 43/08* (2013.01); *H01L 43/14* (2013.01)

(58) Field of Classification Search
  USPC ........................................................ 365/158
  See application file for complete search history.

(56) References Cited

U.S. PATENT DOCUMENTS

| | | | | |
|---|---|---|---|---|
| 2013/0082787 | A1* | 4/2013 | Zhang | G11C 5/005 331/107 R |
| 2014/0056060 | A1* | 2/2014 | Khvalkovskiy | G11C 11/1675 365/158 |
| 2014/0252439 | A1 | 9/2014 | Guo | |
| 2014/0312441 | A1* | 10/2014 | Guo | H01L 27/228 257/427 |
| 2015/0036415 | A1 | 2/2015 | Di Pendina et al. | |
| 2015/0236246 | A1* | 8/2015 | Ishida | H01L 43/04 257/421 |
| 2015/0348606 | A1 | 12/2015 | Buhrman et al. | |
| 2017/0222135 | A1 | 8/2017 | Fukami et al. | |
| 2018/0277695 | A1* | 9/2018 | Garten | H01L 31/032 |
| 2020/0043538 | A1* | 2/2020 | Mihajlovic | H01L 27/226 |

OTHER PUBLICATIONS

S. Fukami et al. "A spin-orbit torque switching scheme with collinear magnetic easy axis and current configuration". Nature Nanotechnology, p. 1-6, 2016.
Guoqiang Yu et al. "Switching of perpendicular magnetization by spin-orbit torques in the absense of external magnetic fields". Nature Nanotechnology, vol. 9, p. 548-554, 2014.
Y.K. Kato et al. "Observation of the Spin Hall Effect in Semiconductors". Science, vol. 306, p. 1910-1913, 2004.
Luqiao Liu et al. Spin torque switching with the giant spin Hall effect of tantalum. 2012.
Luqiao Liu et al. "Current-Induced Switching of Perpendicularly Magnetized Magnetic Layers Using Spin Torque from the Spin Hall Effect". Physical Reveiw Letters, p. 096602-1-096602-05, 2012.
Ki-Seung Lee et al. "Threshold current for switching of a perpendicular magnetic layer induced by spin Hall effect". Applied Physical Letters, 102, p. 1-17, 2013.
Ki-Seung Lee, et al. "Thermally activated switching of perpendicular magnet by spin-orbit spin torque". Applied Physical Letters, 104, 2014.
Shunsuke Fukami et al. "Magnetization switching by spin-orbit torque in an antiferromagnet-ferromagnet bilayer system". Nature Materials, p. 535-542, 2016.
S. Takahashi et al. "Spin injection and detection in magnetic nanostructures". Physical Reveiw B 67, p. 67-70, 2003.
Yeongkyo Seo et al. "Area-Efficient SOT-MRAM With a Schottky Diode". IEEE Electron Device Letters, vol. 37, p. 982, 2016.
Wei Zhang et al. "Spin Hall Effects in Metallic Antiferromagnets". Physical Review Letters,. 113, 2014.

* cited by examiner

SPIN CURRENT MAGNETIZATION ROTATIONAL MAGNETIC ELEMENT, SPIN CURRENT MAGNETIZATION ROTATIONAL MAGNETORESISTANCE EFFECT ELEMENT, AND MAGNETIC MEMORY

BACKGROUND OF THE INVENTION

Field of the Invention

The present invention relates to a spin current magnetization rotational magnetic element, a spin current magnetization rotational magnetoresistance effect element, and a magnetic memory.

Description of Related Art

As magnetoresistance effect elements, a giant magnetoresistance (GMR) element made of a multilayer film including a ferromagnetic layer and a nonmagnetic layer, and a tunneling magnetoresistance (TMR) element in which an insulating layer (a tunnel barrier layer, a barrier layer) is used for a nonmagnetic layer are known. Generally, although a TMR element has a higher element resistance as compared with a GMR element, there is an advantage in that a magnetoresistance (MR) ratio thereof is larger than that of a GMR element. Therefore, attention has focused on a TMR element as an element for magnetic sensors, high frequency components, magnetic heads, and magnetic random access memories (MRAMs).

In an MRAM, data is read and written by utilizing characteristics in which the element resistance of a TMR element changes as magnetization directions of two ferromagnetic layers sandwiching an insulating layer change. As a writing method of MRAMs, a method of performing writing (magnetization reversal) by utilizing a magnetic field generated by a current, and a method of performing writing (magnetization reversal) by utilizing a spin transfer torque (STT) generated by causing a current to flow in a lamination direction of a magnetoresistance effect element are known.

Although the magnetization reversal of a TMR element using an STT is efficient when considered from the viewpoint of energy efficiency, it is reported that a reversal current density required to cause magnetization reversal is high.

From the viewpoint of prolonging a service life of TMR elements, it is preferable that the reversal current density be low. The same applies for GMR elements.

Therefore, in recent years, attention has been focused on magnetization reversal utilizing a pure spin current generated by a spin-orbit interaction as a method for reducing a reversal current (for example, Non-Patent Document 1). The pure spin current generated by a spin-orbit interaction and a Rashba effect at an interface between different materials induces a spin-orbit torque (SOT) and the SOT causes magnetization reversal to occur. Details of these mechanisms have not been clarified so far. A pure spin current is generated when the same number of upward spin electrons and downward spin electrons flow in opposite directions to each other, and flows of electrical charge cancel each other out. Therefore, a current flowing through a magnetoresistance effect element is zero, and thus a service life of a magnetoresistance effect element is expected to be prolonged by using a spin-orbit torque (SOT).

On the other hand, it is reported that it is necessary to disturb the symmetry of magnetization in which the magnetization is reversed by applying an external magnetic field in magnetization reversal using an SOT (for example, Non-Patent Document 2). In order to apply an external magnetic field, a source for generating an external magnetic field is necessary. Providing a separate source for generating an external magnetic field leads to a reduction in degree of integration of an integrated circuit in which a spin current magnetization reversal magnetic element is included. Therefore, methods for enabling magnetization reversal using an SOT without applying an external magnetic field have also been researched.

For example, Non-Patent Document 3 describes that the symmetry of a magnetization intensity is broken by changing an amount of oxygen in an oxide film coupled to a ferromagnetic material in which magnetization is reversed. When the symmetry of the magnetization intensity is broken, magnetization rotation is facilitated, and magnetization reversal using an SOT becomes possible even in the absence of a magnetic field.

PATENT DOCUMENTS

Non-Patent Documents

[Non-Patent Document 1] I. M. Miron, K. Garello, G Gaudin, P.-J. Zermatten, M. V. Costache, S. Auffret, S. Bandiera, B. Rodmacq, A. Schuhl, and P. Gambardella, Nature, 476, 189 (2011).

[Non-Patent document 2] S. Fukami, T. Anekawa, C. Zhang, and H. Ohno, Nature Nanotechnology, DOI: 10.1038/NNANO.2016.29.

[Non-Patent Document 3] Guoqiang Yu, et al., Nature Nanotechnology, DOI: 10.1038/NNAN0.2014.94.

SUMMARY OF INVENTION

However, the method described in Non-Patent Document 3 has a problem in that it is difficult to control an amount of oxygen. Particularly, it is difficult in mass production to form the same gradient in amount of oxygen in each element manufactured in a thin film process. Also, when a magnitude of magnetic anisotropy in an in-plane direction of a magnetoresistance effect element is different, the magnetization of a portion having small magnetic anisotropy may be reversed when an unintended external force (external magnetic field, heat, or the like) is applied. Unintended magnetization reversal causes noise in data and inhibits long-term storage of the data. Particularly, when a size of a ferromagnetic material of a magnetoresistance effect element is such a size that a magnetic wall can be formed, magnetization reversal of a portion having small magnetic anisotropy may induce magnetization reversal of other portions, and there is a likelihood that data may be rewritten.

Also, as a structure for disturbing the symmetry of magnetization in which the magnetization is reversed, it is conceivable to employ a structure in which a wiring is formed inside a circuit that forms an element so that the wiring generates a magnetic field for assisting the magnetization reversal. However, when a structure for assisting magnetization reversal using a wiring is employed, power consumption due to the wiring increases, and there is a problem in that a degree of integration of the circuit is reduced due to the wiring formed.

The present invention has been made in view of the above problems, and it is an objective of the present invention to provide a spin current magnetization rotational magnetic element in which magnetization can be reversed without applying an external magnetic field, and as a result, power saving and a degree of integration can be enhanced. Another objective of the present invention is to provide a spin current magnetization rotational magnetoresistance effect element and a magnetic memory including the above-described excellent spin current magnetization rotational magnetic element.

The present invention provides the following methods in order to solve the above problems.

(1) A spin current magnetization rotational magnetic element according to one aspect of the present invention includes a spin-orbit torque wiring extending in a first direction; a first ferromagnetic layer positioned in a second direction which is a direction intersecting the first direction of the spin-orbit torque wiring, a magnetization direction of the first ferromagnetic layer being configured to change; and a spin injection layer which is in contact with a surface of the spin-orbit torque wiring on a side opposite to the first ferromagnetic layer side and laminated in the second direction, in which the magnetization direction of the first ferromagnetic layer is a Z direction in the second direction, and the magnetization direction of the spin injection layer is an X direction in the first direction.

(2) A spin current magnetization rotational magnetic element according to one aspect of the present invention includes a spin-orbit torque wiring extending in a first direction; a first ferromagnetic layer positioned in a second direction which is a direction intersecting the first direction of the spin-orbit torque wiring, a magnetization direction of the first ferromagnetic layer being configured to change; and a spin injection layer which is in contact with a surface of the spin-orbit torque wiring on a side opposite to the first ferromagnetic layer side and laminated in the second direction, wherein the magnetization direction of the first ferromagnetic layer is an X direction in the first direction, and the magnetization direction of the spin injection layer is a Z direction in the second direction.

(3) The spin current magnetization rotational magnetic element according to the above-described (1) or (2) may have a configuration in which the spin injection layer is made of; a metal selected from a group consisting of Cr, Mn, Co, Fe, and Ni; an alloy containing one or more metal of Cr, Mn, Co, Fe, and Ni; an alloy containing at least one element selected from a group consisting of Cr, Mn, Co, Fe, and Ni and at least one element selected from a group consisting of B, C, and N; or a ferromagnetic material containing a rare-earth element.

(4) The spin current magnetization rotational magnetic element according to any one of the above-described (1) to (3) may have a configuration in which the spin injection layer is a ferromagnetic laminate in which at least two ferromagnetic material layers are alternately laminated multiple times.

(5) The spin current magnetization rotational magnetic element according to the above-described (1) or (2) may have a configuration in which the spin injection layer has a tetragonal crystalline structure and a c-axis length is shorter than an a-axis length in a crystal lattice of the tetragonal crystalline structure.

(6) The spin current magnetization rotational magnetic element according to any one of the above-described (1) to (5) may have a configuration in which a film thickness of the spin-orbit torque wiring is equal to or less than a spin diffusion length of the spin-orbit torque wiring.

(7) The spin current magnetization rotational magnetic element according to any one of the above-described (1) to (5) may have a configuration in which a length in the first direction of the spin injection layer is equal to or greater than a length in the first direction of the spin-orbit torque wiring.

(8) A spin current magnetization rotational magnetoresistance effect element according to one aspect of the present invention includes the spin current magnetization rotational magnetic element according to the above-described aspects, and a nonmagnetic layer and a second ferromagnetic layer disposed in this order on a surface of the first ferromagnetic layer on a side opposite to the spin orbit torque wiring.

(9) A magnetic memory according to one aspect of the present invention includes a plurality of spin current magnetization rotational magnetoresistance effect elements according to the above-described aspect.

According to the spin current magnetization rotational magnetic element according to the aspects described above, magnetization can be rotated without applying an external magnetic field, and as a result, power saving and a degree of integration can be enhanced. Also, according to the above-described aspects, a magnetoresistance effect element and a magnetic memory including such an excellent spin current magnetization rotational magnetic element can be provided.

DETAILED DESCRIPTION OF THE INVENTION

Hereinafter, the present invention will be described in detail with reference to the drawings as appropriate. In the drawings used in the following description, there are cases in which characteristic portions are appropriately enlarged for convenience of illustration so that characteristics of the present invention can be easily understood, and dimensional proportions of respective constituent elements may be different from actual ones. Materials, dimensions, and the like illustrated in the following description are merely examples, and the present invention is not limited thereto and can be implemented with appropriate modifications within a range in which the effects of the present invention are achieved.

First Embodiment

Figure 1:
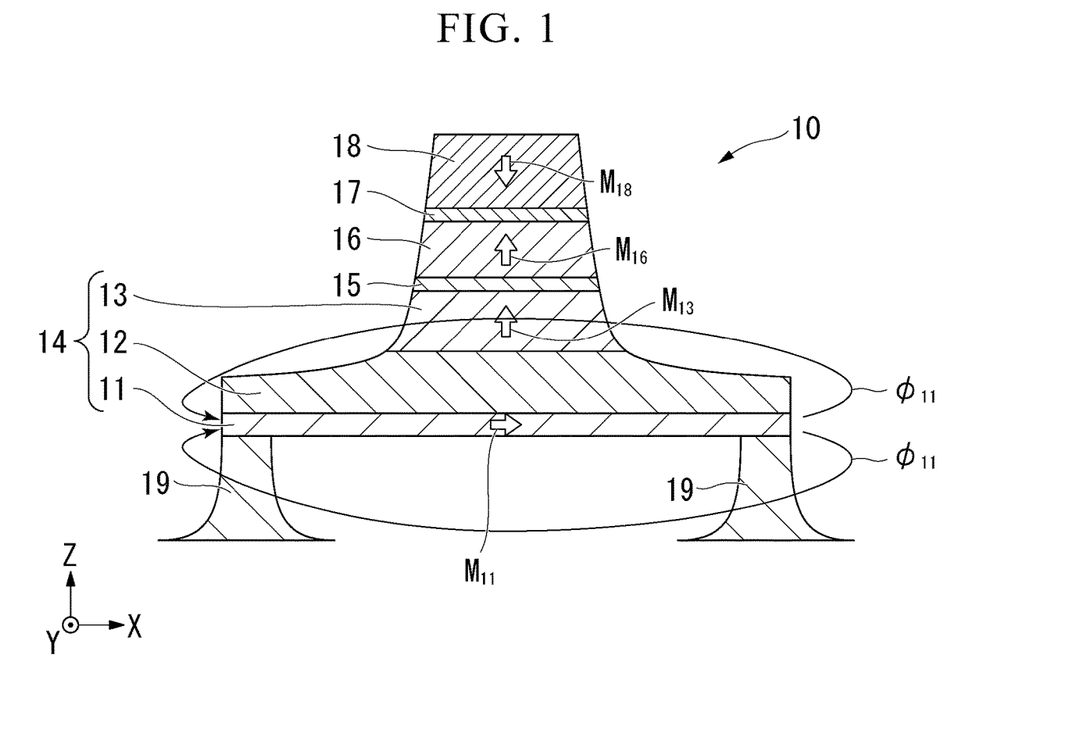
FIG. 1 is a schematic cross-sectional view schematically illustrating a spin current magnetization rotational magnetoresistance effect element according to a first embodiment.

FIG. 1 is a schematic cross-sectional view schematically illustrating a spin current magnetization rotational magnetoresistance effect element according to a first embodiment. A spin current magnetization rotational magnetoresistance effect element 10 according to the first embodiment includes a spin current magnetization rotational magnetic element 14, a nonmagnetic layer 15, a second ferromagnetic layer 16, and an antiferromagnetic coupling layer 17, a magnetization fixed layer 18, and a via 19. The spin current magnetization rotational magnetic element 14 includes a spin injection layer 11, a spin-orbit torque wiring 12, and a first ferromagnetic layer 13.

In the following description, a direction in a first direction in which the spin-orbit torque wiring 12 extends will be defined as an X direction, a direction intersecting the X direction and in a lamination direction (second direction) of the first ferromagnetic layer 13 with respect to the spin-orbit torque wiring 12 will be defined as a Z direction, and a direction being an in-plane direction in which the spin-orbit torque wiring 12 extends and in a third direction which intersects the first direction will be defined as a Y direction.

<Spin Injection Layer>

The spin injection layer 11 is in contact with a surface of the spin-orbit torque wiring 12 on a side opposite to the first ferromagnetic layer 13 side. A magnetization Mn of the spin injection layer 11 is directed in the X direction. A current flowing through the spin injection layer 11 is spin-polarized and injected into the first ferromagnetic layer 13 via the spin-orbit torque wiring 12. The spin injection layer 11 has effects of injecting spin oriented in a predetermined direction into the first ferromagnetic layer 13 together with the spin-orbit torque wiring 12. Also, the spin injection layer 11 need only have magnetization in the X direction, as one component of the magnetization Mu.

The spin injection layer 11 is preferably formed of a magnetic material which has a tetragonal crystalline structure and a c-axis length is shorter than an a-axis length in a crystal lattice of the tetragonal crystalline structure. For example, it is preferable to use a Co—Ho alloy ($CoHo_2$, $HoCo_2$), an Sm—Fe alloy ($SmFe_{12}$), an (Fe, Co) Pt alloy, an FePt alloy, or the like. In the spin injection layer 11 made of these materials, a direction of the magnetization $M_{11}$ tends to be the X direction.

The spin injection layer 11 may be formed of a ferromagnetic material. As the ferromagnetic material, a metal selected from the group consisting of Cr, Mn, Co, Fe, and Ni; an alloy containing one or more metal of Cr, Mn, Co, Fe, and Ni; an alloy containing at least one element selected from a group consisting of Cr, Mn, Co, Fe, and Ni and at least one element selected from a group consisting of B, C, and N; or a ferromagnetic material containing a rare-earth element can be used. Also, the spin injection layer 11 may be a ferromagnetic laminate in which at least two ferromagnetic material layers are alternately laminated multiple times. The ferromagnetic laminate may be, for example, a laminate in which a first ferromagnetic material layer and a second ferromagnetic material layer having different compositions from each other are alternately laminated, or a laminate in which a first ferromagnetic material layer, a nonmagnetic material layer, and a second ferromagnetic material layer are laminated.

In order to cause the magnetization $M_{11}$ to be exhibited in the spin injection layer 11, a thickness of the spin injection layer 11 is preferably 0.5 nm or more.

Also, the spin injection layer 11 has an effect of applying a magnetic flux $\Phi_{11}$ directed in the X direction to the first ferromagnetic layer 13. In order to reliably apply the magnetic flux $\Phi_{11}$ of the spin injection layer 11 to the first ferromagnetic layer 13, a length of the spin injection layer 11 in the X direction is preferably equal to or greater than a length of the spin-orbit torque wiring 12 in the X direction.

<Spin-Orbit Torque Wiring>

The spin-orbit torque wiring 12 extends in the X direction.

The spin-orbit torque wiring 12 is made of a material in which a pure spin current is generated by a spin Hall effect when a current flows. As such a material, any material may be sufficient as long as it has a configuration in which a pure spin current is generated in the spin-orbit torque wiring 12. Therefore, there is no limitation to a material made of a single element, and a material made with a portion configured as a material from which a pure spin current is generated and a portion configured as a material from which no pure spin current is generated, or the like may be used.

The spin Hall effect is a phenomenon in which a pure spin current is induced in a direction perpendicular to a current direction on the basis of spin-orbit interaction when a current flows in a material.

Figure 2:
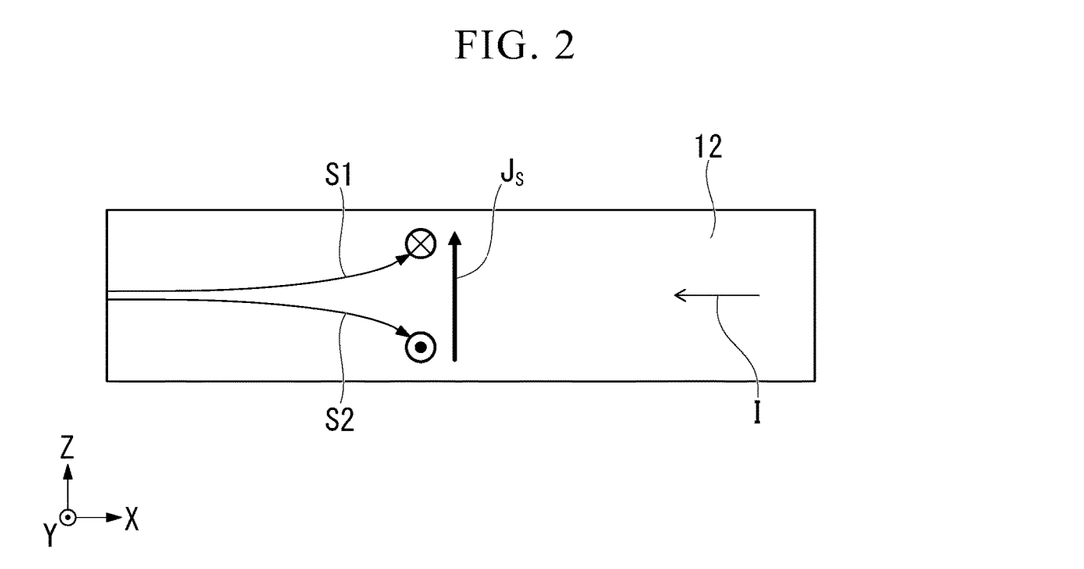
FIG. 2 is a schematic view for describing a spin Hall effect.

FIG. 2 is a schematic view for describing a spin Hall effect. FIG. 2 is a cross-sectional view taken along the X direction of the spin-orbit torque wiring 12 illustrated in FIG. 1. A mechanism in which a pure spin current is generated by the spin Hall effect will be described on the basis of FIG. 2.

As illustrated in FIG. 2, when a potential difference is applied to both ends of the spin-orbit torque wiring 12 in the X direction, a current I flows in the −X direction. When the current I flows, a first spin $S_1$ oriented to a side above of the paper surface (Y direction in FIG. 2) and a second spin $S_2$ oriented to behind the paper surface (−Y direction in FIG. 2) are respectively bent in a direction perpendicular to the current. A normal Hall effect and a spin Hall effect are the same in that electric charges (electrons) in motion (movement) are bent in a direction of the motion (movement), but, while charged particles moving in a magnetic field are subjected to a Lorentz force and a direction of the motion is bent in the normal Hall effect, the spin Hall effect is greatly different in that, even though there is no magnetic field, when electrons merely move (when a current merely flows), a moving direction thereof is bent.

Since the number of electrons of the first spin $S_1$ is equal to the number of electrons of the second spin $S_2$ in a nonmagnetic material (a material which is not a ferromagnetic material), the number of electrons of the first spin $S_1$ directed upward and the number of electrons of the second spin $S_2$ directed downward in the drawing are the same. Therefore, the current as a net flow of electric charge is zero. Such a spin current that does not accompany a current is particularly called a pure spin current.

When a current is caused to flow through a ferromagnetic material, it is the same in that the first spin $S_1$ and the second spin $S_2$ are bent in opposite directions. On the other hand, it is different in that an inside of the ferromagnetic material is in a state in which either the first spin $S_1$ or the second spin $S_2$ is greater than the other, and as a result, a net flow of electric charge occurs (a voltage is generated). Therefore, a material made of only a ferromagnetic material is not included as a material of the spin-orbit torque wiring 12.

Here, when a flow of electrons in the first spin $S_1$ is expressed as J↑, a flow of electrons in the second spin $S_2$ is expressed as J↓, and a spin current is expressed as $J_S$, $J_S = J_\uparrow - J_\downarrow$ is defined. In FIG. 2, $J_S$ as a pure spin current flows in the Z direction. Here, the pure spin current $J_S$ is a flow of electrons with a polarizability of 100%.

Figure 3:
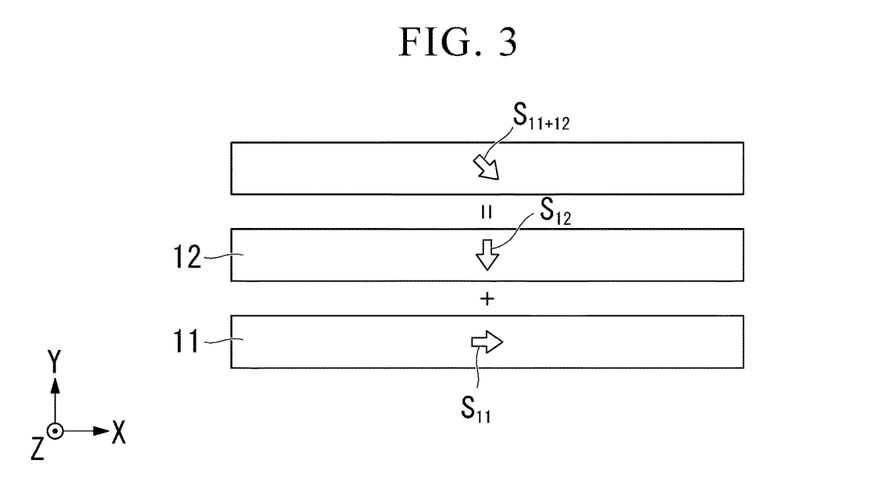
FIG. 3 is a conceptual view schematically illustrating an orientation of spin injected into a first ferromagnetic layer in the spin current magnetization rotational magnetoresistance effect element according to the first embodiment.

FIG. 3 is a conceptual view schematically illustrating a direction of spin injected into the first ferromagnetic layer 13. A direction of the spin injected into the first ferromagnetic layer 13 will be described on the basis of FIG. 3.

An orientation of spin generated in the spin-orbit torque wiring 12 is in the Y direction. In FIG. 2, although the first spin $S_1$ and the second spin $S_2$ are oriented in the Y direction, an orientation of the spin when injected into the first ferromagnetic layer 13 is a vector sum with an orientation of the spin injected from the spin injection layer 11. For example, as illustrated in FIG. 3, when a spin $S_{12}$ generated in the spin-orbit torque wiring 12 is oriented in the −Y direction, an orientation of spin $S_{11} \pm S_{12}$ injected into the first ferromagnetic layer 13 is a direction in which the X direction and the −Y direction are combined (a direction toward the lower right in FIG. 3).

In order to make the orientation of the spin injected into the first ferromagnetic layer 13 be a vector sum with the direction of the spin $S_{11}$ injected from the spin injection layer 11, a thickness of the spin-orbit torque wiring 12 (thickness in the Z direction) is preferably small. The thickness of the spin-orbit torque wiring 12 is preferably equal to or less than a spin diffusion length of the material forming the spin-orbit torque wiring 12.

The material of the spin-orbit torque wiring 12 can be made of a material selected from the group consisting of tungsten, rhenium, osmium, iridium, and an alloy containing at least one or more of these metals. Also, tungsten, rhenium, osmium, and iridium have 5d electrons in an outermost shell and have large orbital angular momentum when five orbitals of the d orbitals are degenerate. Therefore, a spin-orbit interaction that causes the spin Hall effect increases, and a spin current can be efficiently generated.

The spin-orbit torque wiring 12 may contain a nonmagnetic heavy metal. Here, the term "heavy metal" is used to mean a metal having a specific gravity equal to or higher than that of yttrium. The spin-orbit torque wiring 12 may be made of only a nonmagnetic heavy metal.

In this case, the nonmagnetic heavy metal is preferably a nonmagnetic metal having a high atomic number such as the atomic number of 39 or higher having d electrons or f electrons in the outermost shell. This is because such a nonmagnetic metal has a large spin-orbit interaction which causes the spin Hall effect. The spin-orbit torque wiring 12 may be made of only a nonmagnetic metal having a high atomic number such as an atomic number of 39 or higher having d electrons or f electrons in the outermost shell.

When it is assumed that a low resistance part constituting a connection wiring portion for supplying power to the spin-orbit torque wiring 12 is made of Cu (1.7 μΩcm), Y, Zr, Nb, Mo, Ru, Pd, Cd, La, Hf, Ta, W, Re, Os, Ir, Pt, Hg, Ce, Pr, Nd, Sm, Eu, Gd, Tb, Dy, Ho, Er, Tm, Yb, and Lu can be exemplified as the material having an atomic number of 39 or higher and an electrical resistivity higher than twice that of Cu.

Normally, when a current flows in a metal, all of the electrons move in a direction opposite to the current regardless of an orientation of the spin, whereas, since a nonmagnetic metal with a high atomic number having d electrons and f electrons in the outermost shell has a large spin-orbit interaction, a movement direction of the electrons depends on an orientation of the spin of the electrons due to the spin Hall effect and the pure spin current $J_S$ tends to be generated. Particularly, when Ir is used as the nonmagnetic heavy metal, the spin Hall effect is large. Further, a perpendicular magnetic anisotropy larger than that of a conventional material can be added to the first ferromagnetic layer 13 at an interface between Ir and the first ferromagnetic layer 13.

Also, the spin-orbit torque wiring 12 may also contain a magnetic metal. This magnetic metal refers to a ferromagnetic metal or an antiferromagnetic metal. This is because, when a very small amount of a magnetic metal is contained in the nonmagnetic metal, the spin-orbit interaction is enhanced and spin current generation efficiency with respect to a current flowing through the spin-orbit torque wiring 12 can be increased. The spin-orbit torque wiring 12 may be made of only an antiferromagnetic metal.

The spin-orbit interaction is caused by an intrinsic internal field of a substance of the spin-orbit torque wiring material. Therefore, a pure spin current is generated even in a nonmagnetic material. When a very small amount of a magnetic metal is added to the spin-orbit torque wiring material, the magnetic metal itself scatters spin of the electrons flowing therethrough and the spin current generation efficiency is enhanced. However, when an amount of the magnetic metal added is excessively increased, the generated pure spin current is scattered by the added magnetic metal, and as a result, an effect of decreasing the spin current increases. Therefore, a molar ratio of the added magnetic metal is preferably sufficiently smaller than a molar ratio of a main component of a pure spin generation part in the spin-orbit torque wiring. As a reference, the molar ratio of the added magnetic metal is preferably 3% or less.

Also, the spin-orbit torque wiring 12 may include a topological insulator. The spin-orbit torque wiring 12 may be made only of a topological insulator. This topological insulator is a material in which the interior of the substance is an insulator or a highly resistive material while a spin-polarized metallic state is generated on a surface thereof. In this substance, there is something like an internal magnetic field called a spin-orbit interaction. Therefore, a new topological phase is exhibited due to an effect of the spin-orbit interaction even without an external magnetic field. This is a topological insulator and it can generate a pure spin current with high efficiency due to a strong spin-orbit interaction and breaking of rotational symmetry at an edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, and the like are preferable. These topological insulators can generate a spin current with high efficiency.

<First Ferromagnetic Layer>

The first ferromagnetic layer 13 is positioned in the Z direction of the spin-orbit torque wiring. The first ferromagnetic layer 13 functions such that its magnetization direction changes relatively.

As a material of the first ferromagnetic layer 13, a ferromagnetic material, particularly a soft magnetic material, can be applied. For example, a metal selected from the group consisting of Cr, Mn, Co, Fe, and Ni, an alloy containing one or more of these metals, an alloy containing these metals and at least one element selected from the group consisting of B, C, and N, or the like can be used. Specifically, Co—Fe, Co—Fe—B, and Ni—Fe can be exemplified.

An axis of easy magnetization of the first ferromagnetic layer 13 is in the Z direction, and in FIG. 1, a magnetization $M_{13}$ of the first ferromagnetic layer 13 is oriented in the +Z direction. Here, an orientation direction of the magnetization $M_{13}$ is not limited to a case in which it completely coincides with the Z direction and may deviate from the Z direction within a range of in which the effects of the present invention are achieved. A perpendicular magnetization film in which the magnetization $M_{13}$ is in the Z direction can have a large amount of magnetization in the same area (XY plane) and is excellent for integration.

<Nonmagnetic Layer>

A known material can be used for the nonmagnetic layer 15.

For example, when the nonmagnetic layer 15 is made of an insulator (in a case of a tunnel barrier layer), $Al_2O_3$, $SiO_2$, MgO, $MgAl_2O_4$, or the like can be used as the material thereof. In addition to these materials, a material in which a portion of Al, Si, and Mg is substituted with Zn, Be, or the like can also be used. Of these, since MgO and $MgAl_2O_4$ are materials that can realize coherent tunneling, spin can be efficiently injected.

When the nonmagnetic layer 15 is made of a metal, Cu, Au, Ag, or the like can be used as the material thereof.

<Second Ferromagnetic Layer>

A magnetization $M_{16}$ of the second ferromagnetic layer 16 is fixed in one direction (+Z direction). The spin current magnetization rotational magnetoresistance effect element 10 functions such that the direction of the magnetization $M_{13}$ of the first ferromagnetic layer 13 changes relative to the direction of the magnetization $M_{16}$ of the second ferromagnetic layer 16. When it is applied to a coercivity-differing type (pseudo spin valve type) magnetic random access memory (MRAM), a coercivity of the second ferromagnetic layer 16 is larger than a coercivity of the first ferromagnetic layer 13, and when it is applied to an exchange bias type (spin valve type) MRAM, a direction of magnetization in the second ferromagnetic layer 16 is fixed by exchange coupling with the magnetization fixed layer 18 via the antiferromagnetic coupling layer 17.

Also, when the nonmagnetic layer 15 is made of an insulator, the spin current magnetization rotational magnetoresistance effect element 10 is a tunneling magnetoresistance (TMR) element, and when the nonmagnetic layer 15 is made of a metal, the spin current magnetization rotational magnetoresistance effect element 10 is a giant magnetoresistance (GMR) element.

A known material can be used for a material of the second ferromagnetic layer 16. For example, a metal selected from the group consisting of Cr, Mn, Co, Fe and Ni, and an alloy containing one or more of these metals and exhibiting ferromagnetism can be used. It is also possible to use an alloy containing these metals and at least one of elements B, C, and N. Specifically, Co—Fe or Co—Fe—B can be exemplified.

Also, in order to obtain a higher output, it is preferable to use a Heusler alloy such as $Co_2FeSi$ for a material of the second ferromagnetic layer 16. A Heusler alloy contains an intermetallic compound having a chemical composition of $X_2YZ$, in which X indicates a transition metal element from the Co, Fe, Ni, or Cu groups, or a noble metal element in the Periodic Table, Y indicates a transition metal from the Mn, V, Cr, or Ti groups, or an element from the groups for X, and Z indicates a typical element from Group III to Group V. For example, $Co_2FeSi$, $Co_2MnSi$, $Co_2Mn_{1-a}Fe_aAl_bSi_{1-b}$, or the like can be exemplified.

<Antiferromagnetic Coupling Layer, Magnetization Fixed Layer>

The antiferromagnetic coupling layer 17 is nonmagnetic. A direction of a magnetization $M_{18}$ of the magnetization fixed layer 18 is fixed in a direction (−Z direction) opposite to the direction of the magnetization $M_{16}$ of the second ferromagnetic layer 16. The magnetization $M_{16}$ of the second ferromagnetic layer 16 and the magnetization $M_{18}$ of the magnetization fixed layer 18 are antiferromagnetically coupled by sandwiching the antiferromagnetic coupling layer 17 there between. Also, a leakage magnetic field from the second ferromagnetic layer 16 affecting the first ferromagnetic layer 13 can be inhibited. Whether or not the magnetization $M_{16}$ of the second ferromagnetic layer 16 and the magnetization $M_{18}$ of the magnetization fixed layer 18 are antiferromagnetically coupled can be controlled by a material, a film thickness, or the like of the antiferromagnetic coupling layer 17. Although it depends on a material used, a film thickness of the antiferromagnetic coupling layer 17 is preferably 3 Å to 10 Å.

It is preferable that the antiferromagnetic coupling layer 17 contain at least one selected from the group consisting of Ru, Ir, and Rh. For example, IrMn, PtMn, or the like can be used. These elements have a large amount of spin and have a large spin-orbit interaction. Therefore, these elements strongly act on the magnetization $M_{16}$ and $M_{18}$ of the two adjacent ferromagnetic layers (the second ferromagnetic layer 16 and the magnetization fixed layer 18), and the magnetizations $M_{11}$ and $M_{12}$ are strongly antiferromagnetically coupled.

The same material as the second ferromagnetic layer 16 can be used as the material of the magnetization fixed layer 18.

<Via>

The via 19 is connected to a surface of the spin injection layer 11 on a side opposite to the spin-orbit torque wiring 12 side. The via 19 extends in the −Z direction and serves for connection with a semiconductor element or the like.

A material having excellent conductivity can be used for the via 19. As the material of the via 19, for example, copper, aluminum, silver, or the like can be used. When the spin current magnetization rotational magnetoresistance effect element 10 is used singly, the via 19 may be omitted.

<Operating Principle of Spin Current Magnetization Rotational Magnetoresistance Effect Element>

In the spin current magnetization rotational magnetoresistance effect element 10 of the present embodiment, the magnetization can be rotated in the absence of a magnetic field by providing the spin injection layer 11 having the magnetization $M_{11}$ having a component in the X direction with respect to the first ferromagnetic layer 13 having the magnetization $M_{13}$ oriented in the Z direction.

Hereinafter, an operating principle of the spin current magnetization rotational magnetoresistance effect element 10 will be described.

As illustrated in FIG. 2, when the current I is applied to the spin-orbit torque wiring 12, the first spin $S_1$ and the second spin $S_2$ are bent by the spin Hall effect. As a result, the pure spin current Js is generated in the z direction.

The first ferromagnetic layer 13 is disposed in the z direction of the spin-orbit torque wiring 12. Therefore, the spin is injected from the spin-orbit torque wiring 12 into the first ferromagnetic layer 13. The injected spin imparts a spin-orbit torque (SOT) to the magnetization $M_{13}$ of the first ferromagnetic layer 13 and causes magnetization rotation.

When the spin injection layer 11 is not provided, the orientation of the spin $S_1$ and $S_2$ generated in the spin-orbit torque wiring 12 is in the Y direction and perpendicular to the direction of the magnetization $M_{11}$ of the first ferromagnetic layer 13 (Z direction). Therefore, even when an SOT is applied, the magnetization of the first ferromagnetic layer 13 can rotate only by 90°, and the magnetization rotation occurs only stochastically.

On the other hand, when the spin injection layer 11 is provided, the orientation of the spin injected into the first ferromagnetic layer 13 is a vector sum of the orientation of the spin $S_{12}$ (Y direction) generated in the spin-orbit torque wiring 12 and the orientation of the spin $S_{11}$ (X direction) injected from the spin injection layer 11. That is, as illustrated in FIG. 3, the orientation of the spin injected into the first ferromagnetic layer 13 is inclined from the Y direction to the X direction, and the symmetry is disturbed. As a result, a rotation probability of the magnetization $M_{13}$ is asymmetric, and the magnetization $M_{13}$ can be rotated even in the absence of a magnetic field. Also, the magnetic flux $\Phi_{11}$ directed in the X direction is applied to the first ferromagnetic layer 13 from the spin injection layer 11. The magnetic flux $\Phi_{11}$ also assists the magnetization rotation of the magnetization $M_{13}$ of the first ferromagnetic layer 13.

As described above, according to the spin current magnetization rotational magnetoresistance effect element 10 according to the first embodiment, since the spin injection layer 11 is provided inside the element, the magnetization $M_{13}$ of the first ferromagnetic layer 13 (free layer) can be rotated without applying an external force such as an external magnetic field. Therefore, according to the present embodiment, it is possible to provide the spin current magnetization rotational magnetoresistance effect element 10 in which a wiring or the like for applying a magnetic field to incline the magnetization $M_{13}$ is unnecessary and magnetization can be rotated by supplying power to the spin-orbit torque wiring 12 without increasing power consumption. Also, since a wiring or the like for applying a magnetic field to incline the magnetization $M_{13}$ is unnecessary, it is possible to provide the spin current magnetization rotational magnetoresistance effect element 10 without causing a decrease in degree of integration and an increase in manufacturing costs.

The spin current magnetization rotational magnetoresistance effect element 10 can be applied to a magnetic random access memories (MRAM), high frequency components, magnetic sensors, or the like.

The spin current magnetization rotational magnetoresistance effect element 10 may have other layers. For example, an underlayer may be provided on a surface of the first ferromagnetic layer 13 on a side opposite to the nonmagnetic layer 15, and a cap layer may be provided on a surface of the magnetization fixed layer 18 on a side opposite to the antiferromagnetic coupling layer 17.

It is preferable that a layer disposed between the spin-orbit torque wiring 12 and the first ferromagnetic layer 13 do not dissipate spin transferred from the spin-orbit torque wiring 12. For example, it is known that silver, copper, magnesium, aluminum, and the like have a long spin diffusion length of 100 nm or more and do not easily dissipate spin. Also, a thickness of this layer is preferably equal to or less than a spin diffusion length of a substance constituting the layer. When a thickness of the layer is equal to or less than the spin diffusion length, the spin transferred from the spin-orbit torque wiring 12 can be sufficiently transferred to the first ferromagnetic layer 13.

When the direction of the magnetization $M_{16}$ of the second ferromagnetic layer 16 is stably fixed, the antiferromagnetic coupling layer 17 and the magnetization fixed layer 18 may be omitted.

The spin current magnetization rotational magnetoresistance effect element 10 according to the first embodiment can be manufactured by forming, for example, the spin injection layer 11, the spin-orbit torque wiring 12, the first ferromagnetic layer 13, the nonmagnetic layer 15, the second ferromagnetic layer 16, the antiferromagnetic coupling layer 17, and the magnetization fixed layer 18 in this order on a substrate on which the via 19 is formed and processing it into a desired shape. Each layer can be formed by a deposition method such as sputtering. Further, as a method of processing each layer, a processing method such as photolithography can be used. Magnetization directions of the spin injection layer 11, the first ferromagnetic layer 13, the second ferromagnetic layer 16, and the magnetization fixed layer 18 can be defined by controlling materials and film thicknesses constituting these layers.

Second Embodiment

Figure 4:
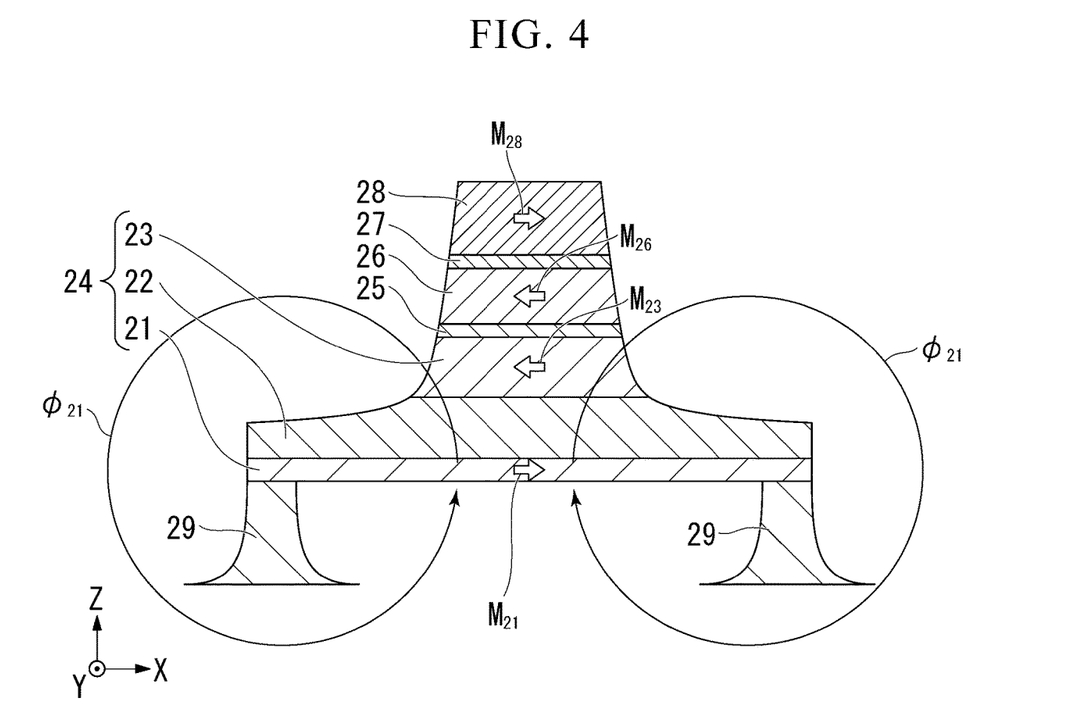
FIG. 4 is a schematic cross-sectional view schematically illustrating a spin current magnetization rotational magnetoresistance effect element according to a second embodiment.

FIG. 4 is a schematic cross-sectional view schematically illustrating a spin current magnetization rotational magnetoresistance effect element according to a second embodiment. A spin current magnetization rotational magnetoresistance effect element 20 according to the second embodiment includes a spin current magnetization rotational magnetic element 24 having a spin injection layer 21, a spin-orbit torque wiring 22, and a first ferromagnetic layer 23, and a nonmagnetic layer 25, a second ferromagnetic layer 26, an antiferromagnetic coupling layer 27, a magnetization fixed layer 28 and a via 29.

spin current magnetization rotational magnetoresistance effect elements

In the spin current magnetization rotational magnetoresistance effect element 20 according to the second embodiment, an axis of easy magnetization of the first ferromagnetic layer 23 is in an X direction, and a magnetization $M_{23}$ of the first ferromagnetic layer 23 is oriented in an −X direction in FIG. 4. Also, a magnetization $M_{21}$ of the spin injection layer 21 is directed in a +Z direction. Also, in accordance with the direction of the magnetization $M_{23}$ of the first ferromagnetic layer 23, a magnetization $M_{26}$ of the second ferromagnetic layer 26 is oriented in the −X direction, and a magnetization $M_{28}$ of the magnetization fixed layer 28 is oriented in the +X direction.

The spin injection layer 21 is preferably formed of a ferromagnetic material. The spin injection layer 21 made of a ferromagnetic material tends to have a magnetization direction in the Z direction. Also, the spin injection layer 21 also has an effect of applying a magnetic flux $\Phi_{21}$ directed in the Z direction to the first ferromagnetic layer 23.

As the ferromagnetic material, a metal selected from the group consisting of Cr, Mn, Co, Fe, and Ni; an alloy containing one or more metal of Cr, Mn, Co, Fe, and Ni; an alloy containing at least one element selected from a group consisting of Cr, Mn, Co, Fe, and Ni and at least one element selected from a group consisting of B, C, and N; or a ferromagnetic material containing a rare-earth element can be used. Also, the spin injection layer 21 may be a ferromagnetic laminate in which at least two ferromagnetic material layers are alternately laminated multiple times. The ferromagnetic laminate may be, for example, a laminate in which a first ferromagnetic material layer and a second ferromagnetic material layer having different compositions from each other are alternately laminated, or a laminate in which a first ferromagnetic material layer, a nonmagnetic material layer, and a second ferromagnetic material layer are laminated.

The spin injection layer 21 may be formed of a magnetic material which has a tetragonal crystalline structure and a c-axis length is shorter than an a-axis length in a crystal lattice of the tetragonal crystalline structure. For example, a Co—Ho alloy ($CoHo_2$, $HoCo_2$), an Sm—Fe alloy ($SmFe_{12}$), an (Fe, Co) Pt alloy, an FePt alloy, or the like may be used.

As in the first embodiment, the spin-orbit torque wiring 22 generates a pure spin current when a current flows. However, an orientation of spin injected into the first ferromagnetic layer 23 is different from that in the first embodiment.

Figure 5:
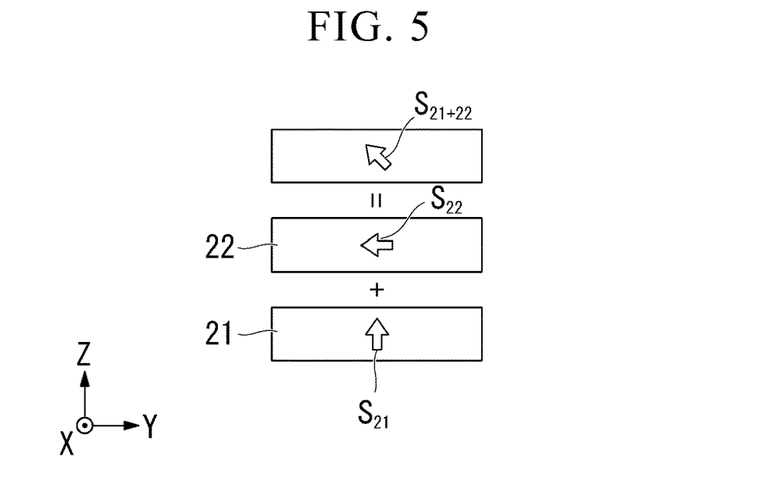
FIG. 5 is a conceptual view schematically illustrating an orientation of a spin current injected into a first ferromagnetic layer in the spin current magnetization rotational magnetoresistance effect element according to the second embodiment.

FIG. 5 is a conceptual view schematically illustrating a direction of the spin injected into the first ferromagnetic layer 23. A direction of the spin injected into the first ferromagnetic layer 23 will be described on the basis of FIG. 5.

Although an orientation of spin $S_{22}$ generated in the spin-orbit torque wiring 22 is in a Y direction as in the first embodiment, an orientation of the spin when injected into the first ferromagnetic layer 23 is a vector sum with an orientation of spin $S_{21}$ injected from the spin injection layer 21. For example, as illustrated in FIG. 5, when the spin $S_{22}$ generated in the spin-orbit torque wiring 22 is oriented in a −Y direction, an orientation of spin $S_{21}+S_{22}$ injected into the first ferromagnetic layer 23 is a direction in which the Z direction and the −Y direction are combined (a direction toward the upper left in FIG. 5).

Materials the same as those in the first embodiment can be used for materials of the spin-orbit torque wiring 22, the first ferromagnetic layer 23, the nonmagnetic layer 25, the second ferromagnetic layer 26, the antiferromagnetic coupling layer 27, the magnetization fixed layer 28, and the via 29.

In the spin current magnetization rotational magnetoresistance effect element 20 of the present embodiment, since the spin injection layer 21 is provided, the orientation of the spin $S_{21}+S_{22}$ injected into the first ferromagnetic layer 23 is a vector sum of the orientation of the spin $S_{22}$ (Y direction) generated in the spin-orbit torque wiring 22 and the orientation of the spin $S_{21}$ (Z direction) injected from the spin injection layer 21. That is, as illustrated in FIG. 5, the orientation of the spin $S_{21}+S_{22}$ injected into the first ferromagnetic layer 23 is inclined from the Y direction to the Z direction, and the symmetry is disturbed. As a result, rotation probability of the magnetization is asymmetric, and the magnetization $M_{23}$ can be rotated even in the absence of a magnetic field. Also, a magnetic flux $\Phi_{21}$ directed in the Z direction is applied to the first ferromagnetic layer 23 from the spin injection layer 21. The magnetic flux $\Phi_{21}$ also assists the magnetization rotation of the magnetization $M_{23}$ of the first ferromagnetic layer 23.

As described above, according to the spin current magnetization rotational magnetoresistance effect element 20 according to the second embodiment, since the spin injection layer 21 is provided inside the element, the magnetization $M_{23}$ of the first ferromagnetic layer 23 (free layer) can be rotated without applying an external force such as an external magnetic field. Therefore, according to the present embodiment, it is possible to provide the spin current magnetization rotational magnetoresistance effect element 20 in which a wiring or the like for applying a magnetic field to incline the magnetization $M_{23}$ is unnecessary and magnetization can be rotated by supplying power to the spin-orbit torque wiring 22 without increasing power consumption. Also, since a wiring or the like for applying a magnetic field to incline the magnetization $M_{23}$ is unnecessary, it is possible to provide the spin current magnetization rotational magnetoresistance effect element 20 without causing a decrease in degree of integration and an increase in manufacturing costs.

Third Embodiment (Spin Current Magnetization Rotational Magnetic Element)

The spin current magnetization rotational magnetic element 14 in the spin current magnetization rotational magnetoresistance effect element 10 of the first embodiment can be used singly as an anisotropic magnetic sensor or as an optical element using a magnetic Kerr effect or a magnetic Faraday effect. The same is applied to the spin current magnetization rotational magnetic element 24 of the spin current magnetization rotational magnetoresistance effect element 20 of the second embodiment. A spin current magnetization rotational magnetic element can be particularly referred to as a spin current magnetization reversal magnetic element when the magnetization is reversed.

As described above, since the spin current magnetization rotational magnetic elements 14 and 24 according to the present embodiment respectively include the spin injection layers 11 and 21 inside the elements, the magnetization $M_{13}$ and $M_{23}$ of the first ferromagnetic layers 13 and 23 (free layers) can be rotated without applying an external force such as an external magnetic field. Therefore, according to the present embodiment, it is possible to provide the spin current magnetization rotational magnetic elements 14 and 24 in which a wiring or the like for applying a magnetic field to incline the magnetization $M_{13}$ and $M_{23}$ is unnecessary and magnetization can be rotated by supplying power to spin-orbit torque wirings 12 and 22 without increasing power consumption. Also, since a wiring or the like for applying a magnetic field to incline the magnetization $M_{13}$ and $M_{23}$ is unnecessary, it is possible to provide the spin current magnetization rotational magnetic elements 14 and 24 without causing a decrease in degree of integration and an increase in manufacturing costs.

Fourth Embodiment (Magnetic Memory)

Figure 6:
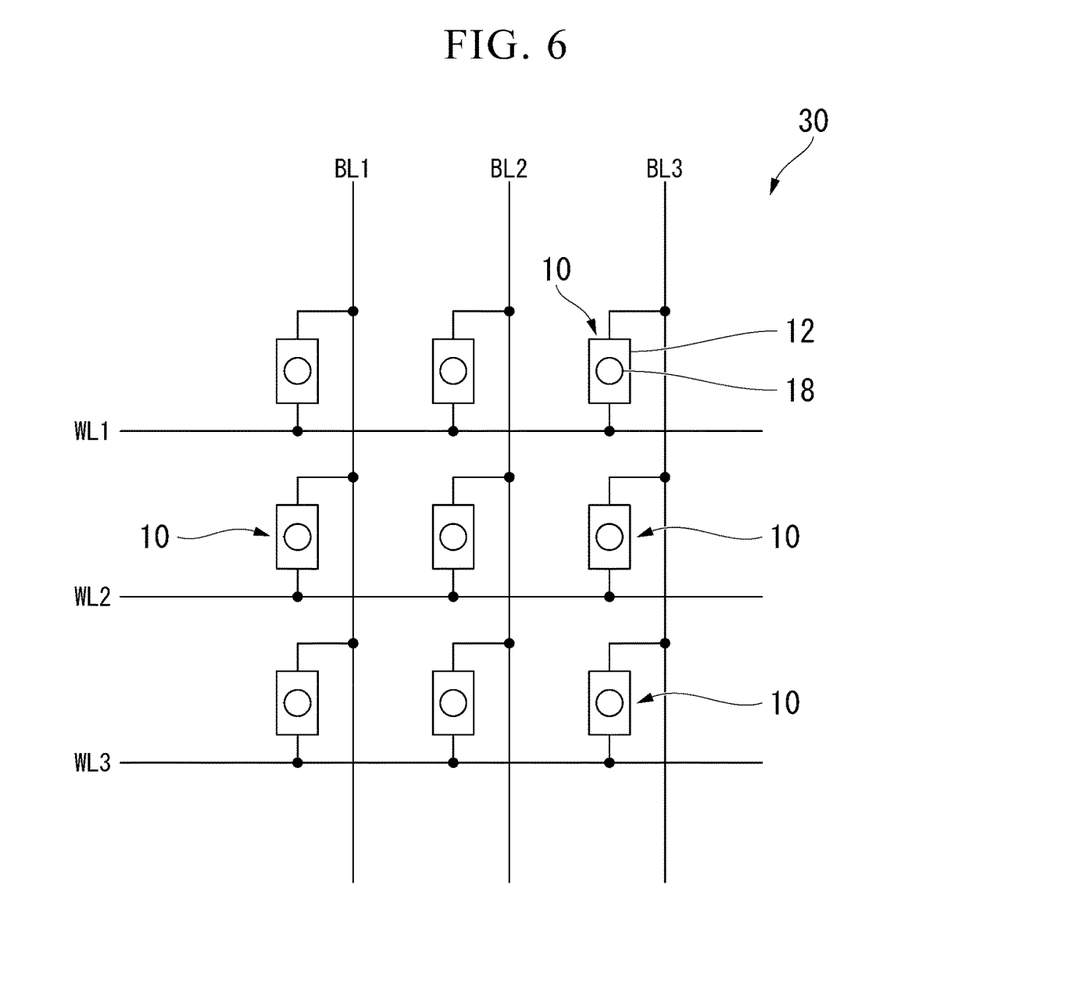
FIG. 6 is a schematic view schematically illustrating a magnetic memory according to a fourth embodiment.

FIG. 6 is a view schematically illustrating a magnetic memory 30 including a plurality of spin current magnetization rotational magnetic elements. The magnetic memory 30 illustrated in FIG. 6 is an example using the spin current magnetization rotational magnetoresistance effect element 10 of the first embodiment, and the spin current magnetization rotational magnetoresistance effect elements 10 are arranged in a 3×3 matrix. FIG. 6 is an example of the magnetic memory, and the number and arrangement of the spin current magnetization rotational magnetoresistance effect elements 10 are arbitrary.

One of word lines WL1 to WL3 is connected to one of bit lines BL1 to BL3, respectively, in the magnetic memory 30. By selecting the word lines WL1 to WL3 and the bit lines BL1 to BL3 to which a current is applied, a current can be caused to flow in the spin-orbit torque wiring 12 of an arbitrary spin current magnetization rotational magnetoresistance effect element 10.

When a current flows in the spin-orbit torque wiring 12, the magnetization of the first ferromagnetic layer 13 of the spin current magnetization rotational magnetoresistance effect element 10 is rotated by the SOT effect due to the spin injected from the spin-orbit torque wiring 12 and by the STT effect due to the spin injected from the spin injection layer 11. In this way, data can be written to a plurality of spin current magnetization rotational magnetoresistance effect elements 10, data can be read out by causing a current to flow in a lamination direction of the plurality of spin current magnetization rotational magnetoresistance effect elements 10, and thereby these can be utilized as a memory.

EXPLANATION OF REFERENCES 10, 20 Spin current magnetization rotational magnetoresistance effect element
11, 21 Spin injection layer
12, 22 Spin-orbit torque wiring
13, 23 First ferromagnetic layer 14, 24 Spin current magnetization rotational magnetic element
15, 25 Nonmagnetic layer
16, 26 Second ferromagnetic layer
17, 27 Antiferromagnetic coupling layer
18, 28 Magnetization fixed layer
19, 29 Via
30 Magnetic memory

What is claimed is:

1. A spin current magnetization rotational magnetic element comprising:
    a spin-orbit torque wiring extending in a first direction;
    a first ferromagnetic layer positioned in a second direction which is a direction intersecting the first direction of the spin-orbit torque wiring, a magnetization direction of the first ferromagnetic layer being configured to change; and
    a spin injection layer which is in contact with a surface of the spin-orbit torque wiring on a side opposite to the first ferromagnetic layer side and laminated in the second direction, wherein
    the magnetization direction of the first ferromagnetic layer has a Z direction component in the second direction,
    a magnetization direction of the spin injection layer has an X direction component in the first direction, and
    the spin injection layer is formed of a ferromagnetic material.

2. The spin current magnetization rotational magnetic element according to claim 1, wherein the spin injection layer is made of: a metal selected from a group consisting of Cr, Mn, Co, Fe, and Ni; an alloy containing one or more metal of Cr, Mn, Co, Fe, and Ni; an alloy containing at least one element selected from a group consisting of Cr, Mn, Co, Fe, and Ni and at least one element selected from a group consisting of B, C, and N; or a ferromagnetic material containing a rare-earth element.

3. The spin current magnetization rotational magnetic element according to any one of claim 1, wherein the spin injection layer is a ferromagnetic laminate in which at least two ferromagnetic material layers are alternately laminated multiple times.

4. The spin current magnetization rotational magnetic element according to claim 1, wherein the spin injection layer has a tetragonal crystalline structure and a c-axis length is shorter than an a-axis length in a crystal lattice of the tetragonal crystalline structure.

5. The spin current magnetization rotational magnetic element according to claim 1, wherein a film thickness of the spin-orbit torque wiring is equal to or less than a spin diffusion length of the spin-orbit torque wiring.

6. The spin current magnetization rotational magnetic element according to claim 1, wherein a length in the first direction of the spin injection layer is equal to or greater than a length in the first direction of the spin-orbit torque wiring.

7. A spin current magnetization rotational magnetoresistance effect element comprising:
    the spin current magnetization rotational magnetic element according to claim 1; and
    a nonmagnetic layer and a second ferromagnetic layer disposed in this order on a surface of the first ferromagnetic layer on a side opposite to the spin-orbit torque wiring.

8. A magnetic memory comprising a plurality of spin current magnetization rotational magnetoresistance effect elements according to claim 7.

9. A spin current magnetization rotational magnetic element comprising:
    a spin-orbit torque wiring extending in a first direction;
    a first ferromagnetic layer positioned in a second direction which is a direction intersecting the first direction of the spin-orbit torque wiring, a magnetization direction of the first ferromagnetic layer being configured to change; and
    a spin injection layer which is in contact with a surface of the spin-orbit torque wiring on a side opposite to the first ferromagnetic layer side and laminated in the second direction, wherein
    the magnetization direction of the first ferromagnetic layer is an X direction in the first direction,
    the magnetization direction of the spin injection layer is a Z direction in the second direction, and
    the spin injection layer is formed of a ferromagnetic material.

10. The spin current magnetization rotational magnetic element according to claim 9, wherein the spin injection layer is made of: a metal selected from a group consisting of Cr, Mn, Co, Fe, and Ni; an alloy containing one or more metal of Cr, Mn, Co, Fe, and Ni; an alloy containing at least one element selected from a group consisting of Cr, Mn, Co, Fe, and Ni and at least one element selected from a group consisting of B, C, and N; or a ferromagnetic material containing a rare-earth element.

11. The spin current magnetization rotational magnetic element according to claim 9, wherein the spin injection layer is a ferromagnetic laminate in which at least two ferromagnetic material layers are alternately laminated multiple times.

12. The spin current magnetization rotational magnetic element according to claim 9, wherein the spin injection layer has a tetragonal crystalline structure and a c-axis length is shorter than an a-axis length in a crystal lattice of the tetragonal crystalline structure.

13. The spin current magnetization rotational magnetic element according to claim 9, wherein a film thickness of the spin-orbit torque wiring is equal to or less than a spin diffusion length of the spin-orbit torque wiring.

14. The spin current magnetization rotational magnetic element according to claim 9, wherein a length in the first direction of the spin injection layer is equal to or greater than a length in the first direction of the spin-orbit torque wiring.

15. A spin current magnetization rotational magnetoresistance effect element comprising:
    the spin current magnetization rotational magnetic element according to claim 9; and
    a nonmagnetic layer and a second ferromagnetic layer disposed in this order on a surface of the first ferromagnetic layer on a side opposite to the spin-orbit torque wiring.

16. A magnetic memory comprising a plurality of spin current magnetization rotational magnetoresistance effect elements according to claim 15.

* * * * *